(12) United States Patent
Hershberger et al.

(10) Patent No.: US 8,466,501 B2
(45) Date of Patent: Jun. 18, 2013

(54) ASYMMETRIC SILICON-ON-INSULATOR (SOI) JUNCTION FIELD EFFECT TRANSISTOR (JFET) AND A METHOD OF FORMING THE ASYMMETRICAL SOI JFET

(75) Inventors: Douglas B. Hershberger, Essex Junction, VT (US); Richard A. Phelps, Colchester, VT (US); Robert M. Rassel, Colchester, VT (US); Stephen A. St. Onge, Colchester, VT (US); Michael J. Zierak, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 417 days.

(21) Appl. No.: 12/784,583

(22) Filed: May 21, 2010

(65) Prior Publication Data

US 2011/0284930 A1     Nov. 24, 2011

(51) Int. Cl.
*H01L 29/808* (2006.01)
(52) U.S. Cl.
USPC ............. 257/270; 257/E21.611; 438/309
(58) Field of Classification Search
USPC .... 257/270, 303, E21.611, E21.612; 438/309
See application file for complete search history.

(56) References Cited

U.S. PATENT DOCUMENTS

| 6,307,223 | B1 | 10/2001 | Yu |
| 2008/0315266 | A1 | 12/2008 | Eshun et al. |
| 2009/0101941 | A1* | 4/2009 | Ellis-Monaghan et al. .. 257/270 |
| 2009/0243676 | A1* | 10/2009 | Feng ............................ 327/157 |

OTHER PUBLICATIONS

U.S. Appl. No. 11/875,190, filed Oct. 19, 2007.
U.S. Appl. No. 11/787,627, filed Jun. 25, 2007.

* cited by examiner

*Primary Examiner* — Thomas L Dickey
(74) *Attorney, Agent, or Firm* — Gibb & Riley, LLC; Anthony J. Canale

(57) ABSTRACT

An asymmetric silicon-on-insulator (SOI) junction field effect transistor (JFET) and a method. The JFET includes a bottom gate on an insulator layer, a channel region on the bottom gate and, on the channel region, source/drain regions and a top gate between the source/drain regions. STIs isolate the source/drain regions from the top gate and a DTI laterally surrounds the JFET to isolate it from other devices. Non-annular well(s) are positioned adjacent to the channel region and bottom gate (e.g., a well having the same conductivity type as the top and bottom gates can be connected to the top gate and can extend down to the insulator layer, forming a gate contact on only a portion of the channel region, and/or another well having the same conductivity type as the channel and source/drain regions can extend from the source region to the insulator layer, forming a source-to-channel strap).

19 Claims, 10 Drawing Sheets

ASYMMETRIC SILICON-ON-INSULATOR (SOI) JUNCTION FIELD EFFECT TRANSISTOR (JFET) AND A METHOD OF FORMING THE ASYMMETRICAL SOI JFET

BACKGROUND

1. Field of the Invention

The embodiments relate to junction field effect transistors (JFETs), and more specifically, to an asymmetric semiconductor-on-insulator junction field effect transistor (SOI JFET), a method of forming such an asymmetric SOI JFET, and a design structure for the SOI JFET.

2. Description of the Related Art

Recently, symmetric dual-gate and wrapped-gate junction field effect transistors (JFETs) have been developed. Advantages associated with dual-gate JFETs include a relatively large conduction area for a high on-current and tight channel region control for a low off-current, as compared to single-gate JFETs. Advantages associated with wrapped-gate JFETs include an even larger conduction area for a high on-current and even tighter channel region control for a low off-current. However, there is a need in the art for improvements to these JFET structures in order to reduce lateral dimensions and/or optimize source-to-channel link-up.

SUMMARY

Disclosed herein are embodiments of an asymmetric semiconductor-on-insulator junction field effect transistor (SOI JFET). The embodiments of the asymmetric SOI JFET can comprise a bottom gate on an insulator layer above a semiconductor substrate. The bottom gate can comprise a semiconductor with a first conductivity type. A channel region can be positioned on the bottom gate. The channel region can comprise a semiconductor with a second conductivity type that is different from the first conductivity type. Source and drain regions can be positioned on the channel region. The source and drain regions can comprise a semiconductor with the same conductivity type as the channel region (i.e., the second conductivity type). Additionally, a top gate can be positioned on the channel region between and electrically isolated from the source and drain regions. The top gate can comprise a semiconductor with the same conductivity type as the bottom gate (i.e., the first conductivity type).

In one embodiment, the asymmetric SOI JFET can further comprise a gate contact comprising a well region having the same conductivity type as the bottom and top gates (i.e., the first conductivity type). This gate contact can be positioned laterally immediately adjacent to (i.e., can abut) the channel region and can extend vertically down to the bottom gate and, preferably, through the bottom gate to the insulator layer. It can further be non-annular with respect to the channel region. That is, it can be positioned adjacent to only a portion of the channel region (e.g., on the source or drain side of the channel region) rather than laterally surrounding the channel region. Such a non-annular gate contact provides a trade-off between the advantages of having a wrapped gate JFET and a lower resistance contact to the bottom gate with the disadvantage of having relatively large lateral dimensions.

In another embodiment, the asymmetric SOI JFET can comprise a source-to-channel strap comprising a well region having the same conductivity type as the source and channel regions (i.e., the second conductivity type). This strap can extend vertically from the source region through the channel region to at least the bottom gate and, preferably, through the channel region and bottom gate to the insulator layer. Since the strap is only on the source side of the SOI JFET, it is non-annular with respect to the channel region. Such a strap provides improved link-up between the source and channel regions and, thereby reduces the on resistance of the SOI JFET.

In yet another embodiment, the asymmetric SOI JFET can comprise both a source-to-channel strap, as described above, adjacent to the source side of the SOI JFET and a gate contact, as described above, adjacent to the channel region and bottom gate at some other location (e.g., on the drain side of the SOI JFET).

Also disclosed herein are embodiments of a method of forming an asymmetric semiconductor-on-insulator junction field effect transistor (SOI JFET). The method embodiments can comprise forming a bottom gate on an insulator layer above a semiconductor substrate. The bottom gate can be formed such that it comprises a semiconductor with a first conductivity type. A channel region can be formed on the bottom gate. The channel region can be formed such that it comprises a semiconductor with a second conductivity type that is different from the first conductivity type. Then, on the channel region, the following features can be formed: (1) shallow trench isolation (STI) regions; (2) source and drain regions in areas defined by the STI regions; and (3) a top gate, which is positioned laterally between the source and drain regions and which is electrically isolated from the source and drain regions by the STI regions. The source and drain regions can be formed such that they each have the same conductivity type as the channel region (i.e., the second conductivity type) and the top gate can be formed such that it has the same conductivity type as the bottom gate (i.e., the first conductivity type).

In one embodiment, the method can further comprise forming a gate contact comprising a well region having the same conductivity type as the bottom and top gates (i.e., the first conductivity type). This gate contact can be formed such that it extends vertically down through the channel region to the bottom gate and, preferably, such that it extends through the channel region and bottom gate to the insulator layer. It can further be formed such that it is non-annular with respect to the channel region. That is, it can be formed such that it is positioned adjacent to only a portion of the channel region (e.g., on the source or drain side of the channel region) rather than laterally surrounding the channel region. Such a non-annular gate contact provides a trade-off between the advantages of having a wrapped gate JFET and a lower resistance contact to the bottom gate with the disadvantage of having relatively large lateral dimensions.

In another embodiment, the method can comprise forming a source-to-channel strap comprising a well region having the same conductivity type as the source and channel regions (i.e., the second conductivity type). This strap can be formed such that it extends vertically from the source region down through the channel region to the bottom gate and, preferably, such that it extends vertically from the source region down through the channel region and the bottom gate to the insulator layer. Since the strap is formed so that it only extends from the source region, it is also formed so that it is non-annular with respect to the channel region. Such a strap provides improved link-up between the source and channel regions and, thereby reduces the on resistance of the SOI JFET.

In yet another embodiment, the method can comprise forming both a source-to-channel strap, as described above, adjacent to the channel region on the source side of the SOI JFET and forming a gate contact, as described above, adjacent to the channel region and bottom gate at some other location (e.g., on the drain side of the SOI JFET).

Also disclosed herein are embodiments of a design structure for the SOI JFET embodiments, described above.

DETAILED DESCRIPTION

Figure 1A:
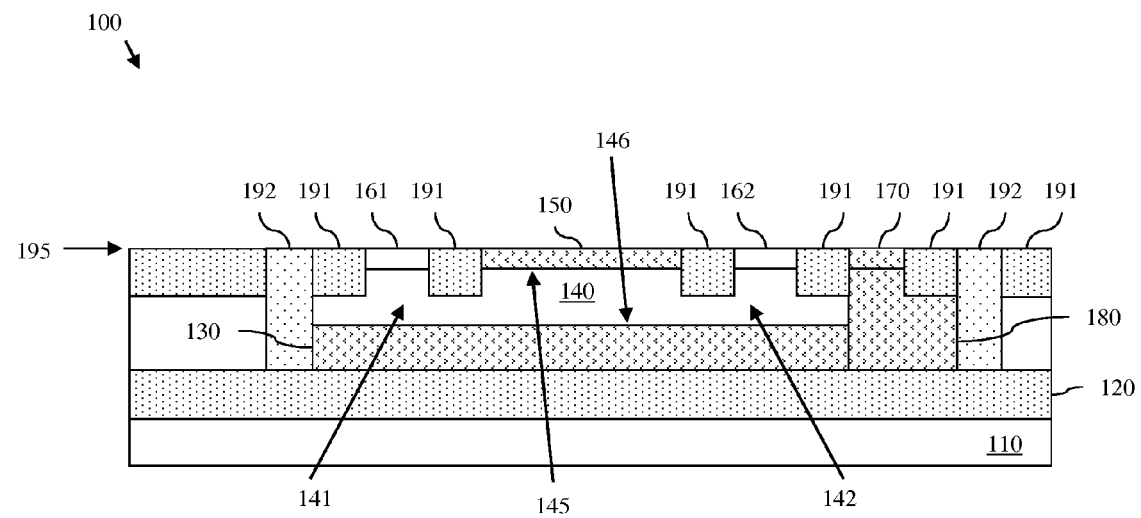
FIG. 1A is a schematic cross-section diagram illustrating a first embodiment of an asymmetric semiconductor-on-insulator junction field effect transistor (SOI JFET)

As mentioned above, recently, symmetric dual-gate and wrapped-gate junction field effect transistors (JFETs) have been developed. Advantages associated with symmetric dual-gate JFETs include a relatively large conduction area for a high on-current and tight channel region control for a low off-current, as compared to single-gate JFETs. Advantages associated with symmetric wrapped-gate JFETs include an even larger conduction area for a high on-current and even tighter channel region control for a low off-current. Unfortunately, a disadvantage associated specifically with symmetric, wrapped-gate, JFETs is the relatively large lateral dimensions, due to the multiple annular well regions. Furthermore, a disadvantage associated with both symmetric dual-gate and wrapped-gate JFETs (depending upon device performance requirements and specifications) is insufficient source-to-channel link-up. Thus, there is a need in the art for an improved JFET structure that balances the need for a relatively large conduction area for a high on-current and tight channel region control for a low off-current, as compared to single-gate JFETs with the desire to have reduced lateral dimensions and/or increased source-to-channel link-up.

In view of the foregoing, disclosed herein are embodiments of an asymmetric semiconductor-on-insulator junction field effect transistor (SOI JFET). The asymmetric SOI JFET comprises an insulator layer on a substrate, a bottom gate on the insulator layer, a channel region on the bottom gate and, on the channel region, source/drain regions and a top gate positioned laterally between the source/drain regions. Shallow trench isolation structures (STIs) electrically isolate the source/drain regions from the top gate and a deep trench isolation structure (DTI) laterally surrounds the JFET structure to electrically isolate it from other devices on the substrate. One or more non-annular well regions can be positioned laterally adjacent to the channel region within the confines of the DTI, thereby creating the asymmetric configuration. For example, a well region having the same conductivity type as the top and bottom gates can extend vertically down through the channel region to the bottom gate and, preferably, through the channel region and bottom gate to the insulator layer so as form a gate contact on only one side of the JFET structure. Such a non-annular gate contact provides a trade-off between the advantages of having a wrapped gate JFET and a lower resistance contact to the bottom gate with the disadvantage of having relatively large lateral dimensions. Additionally or alternatively, another well region having the same conductivity type as the channel region and as the source/drain regions can extend vertically from the source region down through the channel region to the bottom gate and, preferably, through the channel region and the bottom gate to the insulator layer so as to form a source-to-channel strap. Such a strap provides improved link-up between the source and channel regions. Also disclosed are method embodiments for forming the above-described asymmetric SOI JFET embodiments.

More particularly, referring to FIGS. 1A-B, 2A-B and 3A-B, disclosed are embodiments 100, 200, 300, respectively, of an asymmetric semiconductor-on-insulator junction field effect transistor (SOI JFET). The embodiments 100, 200, 300 of the asymmetric SOI JFET can comprise a bottom gate 130, 230, 330 (i.e., a first gate) on an insulator layer 120, 220, 320 above a semiconductor substrate 110, 210, 310. Specifically, the semiconductor substrate 110, 210, 310 can comprise, for example, a single crystalline silicon substrate that has either a first conductivity type or a second conductivity type different from the first conductivity type. For example, the semiconductor substrate 110, 210, 310 can comprise P− silicon (i.e., silicon that is lightly doped with a P-type conductivity dopant). The insulator layer 120, 220, 320 on the substrate 110, 210, 310 can comprise a buried dielectric layer (e.g., a buried silicon oxide ($SiO_2$) layer or BOX layer, a buried silicon nitride (SiN) layer, a buried sapphire layer, etc.). The first bottom gate 130, 230, 330 can comprise a semiconductor with a first conductivity type and with a relatively high net conductivity. For example, the bottom gate 130, 230, 330 can comprise P+ silicon (i.e., silicon that is heavily doped with a P-type conductivity dopant).

The embodiments 100, 200, 300 of the asymmetric SOI JFET can further comprise a channel region 140, 240, 340 positioned on the bottom gate 130, 230, 330. The channel region 140, 240, 340 can comprise a semiconductor with a second conductivity type that is different from the first conductivity type and with a relatively low or moderate net conductivity. For example, the channel region 140, 240, 340 can comprise N− or N silicon (i.e., silicon that is lightly or moderately doped with an N-type conductivity dopant).

The embodiments 100, 200, 300 of the asymmetric SOI JFET can further comprise discrete source and drain regions 161-162, 261-262, 361-362 positioned on and at opposite sides 141-142, 241-242, 341-342, respectively, of the channel region 140, 240, 340 and a top gate 150, 250, 350 (i.e., a second gate) positioned laterally between the source and drain regions 161-162, 261-262, 361-362. The source and drain regions 161-162, 261-262, 361-362 can comprise a semiconductor with the same conductivity type as the channel region 140, 240, 340 (i.e., the second conductivity type), but with a relatively high net conductivity (i.e., a net conductivity that is greater than that of the channel region 140, 240, 340). For example, the source and drain regions 161-162, 261-262, 361-362 can comprise N+ silicon or polysilicon (i.e., silicon or polysilicon that is heavily doped with an N-type conductivity dopant). The top gate 150, 250, 350 can, on the other hand, comprise a semiconductor with the same conductivity type as the bottom gate 130, 230, 330 (i.e., the first conductivity type) and with essentially the same relatively high net conductivity. For example, the top gate 150, 250, 350 can comprise P+ silicon or polysilicon (i.e., silicon or polysilicon that is heavily doped with a P-type conductivity dopant).

The embodiments 100, 200, 300 of the asymmetric SOI JFET can further comprise shallow trench isolation (STI) structures 191, 291, 391 (i.e., first trench isolation structures) on the channel region 140, 240, 340 and laterally surrounding the source region 161, 261, 361 and the drain region 162, 262, 362 separately so as to electrically isolate the source region 161, 261, 361 and the drain region 162, 262, 362 from at least the top gate 150, 250, 350. The STI structures 191, 291, 391 can each comprise a relatively shallow trench extending from the top surface 195, 295, 395 of the structure 100, 200, 300 (and, more particularly, the top surface of the source and drain regions and top gate) down to at least the top surface 145, 245, 345, but not as deep as the bottom surface 146, 246, 346, of the channel region 140, 240, 340. The STI trenches can be lined (optionally) and filled with one or more isolation materials (e.g., a silicon oxide material, a silicon nitride material, a silicon oxynitride material or any other suitable isolation material).

The embodiments 100, 200, 300 of the asymmetric SOI JFET can further comprise an annular deep trench isolation (DTI) structure 192, 292, 392 (i.e., a second trench isolation structure) on the insulator layer 120, 220, 320 and laterally surrounding the asymmetric SOI JFET so as to electrically isolate it from other devices on the substrate 110, 210, 310. Thus, the DTI structure 192, 292, 392 defines the lateral boundaries of the asymmetric SOI JFET 100, 200, 300. The DTI structure 192, 292, 392 can comprise a relatively deep trench extending from the top surface 195, 295, 395 of the structure 100, 200, 300 (and, more particularly, the top surface of the source and drain regions and top gate) down to the insulator layer 120, 220, 320. The DTI trench can be lined (optionally) and filled with one or more isolation materials (e.g., a silicon oxide material, a silicon nitride material, a silicon oxynitride material or any other suitable isolation material).

In addition to the features described above, the embodiments 100, 200, 300 of the asymmetric SOI JFET can further comprise one or more non-annular well regions positioned laterally adjacent to one portion of the channel region 140, 240, 340 and bottom gate 130, 230, 330 (e.g., on the source side or drain side of the SOI JFET) within the confines of the DTI 192, 292, 392, thereby creating the asymmetric configuration.

Figure 1B:
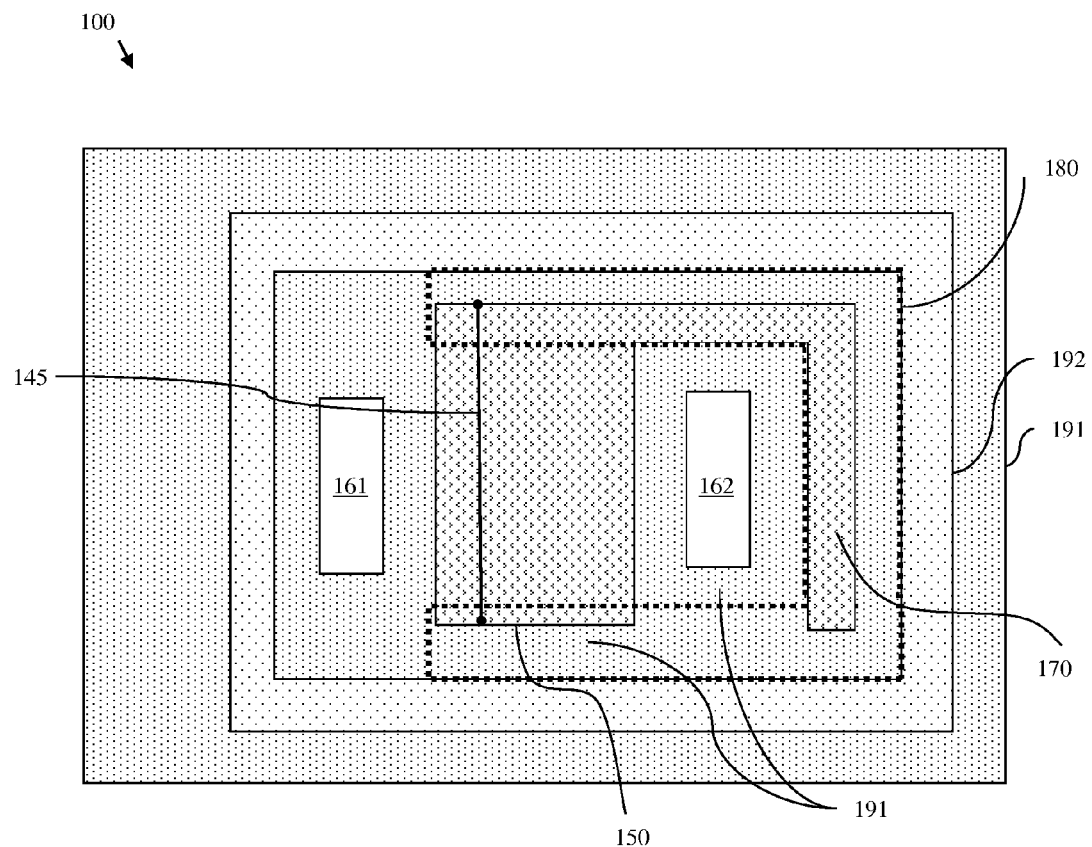
FIG. 1B is a top view diagram of the first embodiment of the asymmetric SOI JFET.

Specifically, referring in combination to the cross-section and top view diagrams, respectively, of FIGS. 1A and 1B, in one embodiment 100, the asymmetric SOI JFET can further comprise a gate contact 180 (i.e., a reach-through contact region or sinker contact region). This gate contact 180 can comprise, for example, a well region (i.e., a deep dopant implant region) having the same conductivity type as the bottom and top gates 130, 150 (i.e., the first conductivity type) and also having essentially the same net conductivity as the bottom and top gates 130, 150. For example, the gate contact 180 can comprise a P+ well region.

This gate contact 180 can extend vertically down through the channel region 140 to the bottom gate 130. Preferably, this gate contact 180 can extend vertically down through the channel region and the bottom gate 130 to the insulator layer 120 such that it is positioned laterally immediately adjacent to both the channel region 140 and the bottom gate 130. The gate contact 180 can further be non-annular with respect to the channel region 140. That is, it can be positioned adjacent to only a portion of the channel region 140 (e.g., on the source side 141 only of the SOI JFET or on the drain side 142 only of the SOI JFET, as shown) rather than laterally surrounding the entire channel region 140. Such a non-annular gate contact 180 provides a trade-off between the advantages of having a wrapped gate JFET and a lower resistance contact to the bottom gate with the disadvantage of having relatively large lateral dimensions.

It should be noted that in the embodiments shown in FIGS. 1A-B, the top gate 150, channel region 140 and bottom gate 130 can each have a same width and essentially aligned ends (e.g., the ends of the bottom gate and channel region do not extend laterally beyond the ends of the top gate) so as to prevent a path where the bottom gate 130 and top gate 150 do not effectively pinch off (i.e., deplete fully and turn off) the channel region 140. However, if the ends are not so aligned (i.e., if the ends of the bottom gate 130 extend laterally beyond the ends of the top gate 150 to, for example, the deep trench isolation region 192), then the gate contact 180 (i.e., the P+well region) can further be configured, as shown in FIG. 1B, such that it is overlapped by both ends of the top gate 150, thereby preventing a path where the bottom gate 130 and top gate 150 do not pinch off (i.e., deplete fully and turn off) the channel region 140.

Finally, optionally, the gate contact 180 can be electrically connected to the top gate 150 by a conductive strap 170. As illustrated, this conductive strap 170 can comprise, for example, the same doped semiconductor material that forms the top gate 150 patterned such that it extends laterally from the top gate 150 to the gate contact 180. Those skilled in the art will recognize that if the gate contact 180 is not electrically connected to the top gate 150 by such a conductive strap 170, it must be separately contacted in order to apply a voltage to the back gate 130. It should be noted that STI structures 191 can be used to electrically isolate the conductive strap 170 from the source/drain regions 161, 162.

Figure 2A:
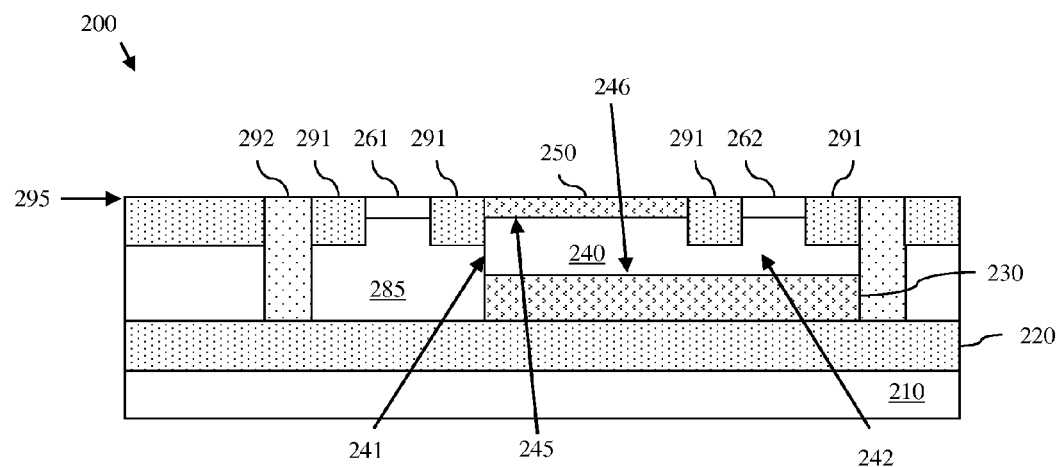
FIG. 2A is a schematic cross-section diagram illustrating a second embodiment of an asymmetric SOI JFET.
Figure 2B:
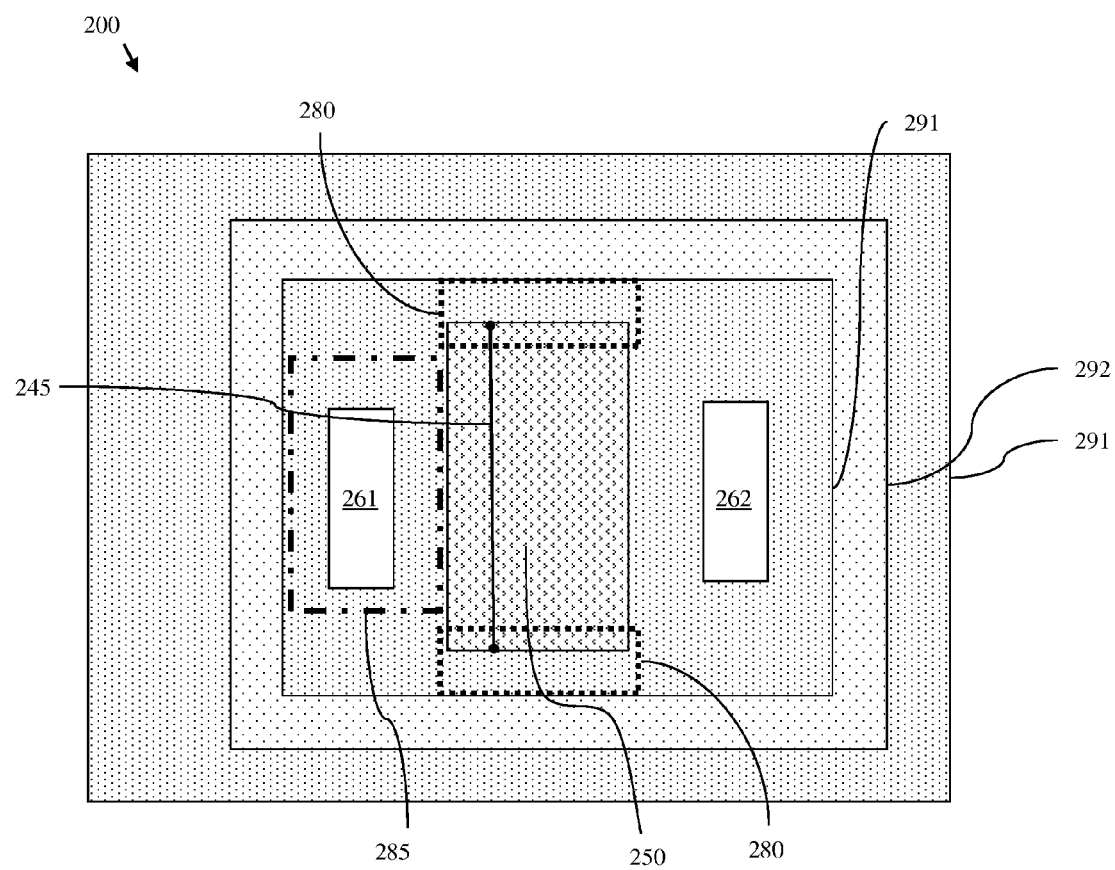
FIG. 2B is a top view diagram of the second embodiment of the asymmetric SOI JFET.

Referring in combination to the cross-section and top view diagrams, respectively, of FIGS. 2A and 2B, in another embodiment 200, the asymmetric SOI JFET can comprise a conductive source-to-channel strap 285. This source-to-channel strap 285 can comprise a well region (i.e., a deep dopant implant region) having the same conductivity type as the source 261 and channel 240 regions (i.e., the second conductivity type) and having essentially the same net conductivity as the source region 261. For example, the source-to-channel strap 285 can comprise an N+ well region.

This source-to-channel strap 285 can extend vertically from the source region 261 down through the channel region 240 to the bottom gate 230. Preferably, this source-to-channel strap 285 can extend vertically from the source region 261 down through the channel region 240 and the bottom gate 230 to the insulator layer 220 such that it is positioned laterally immediately adjacent to the channel region 240 and bottom gate 230. Since the source-to-channel strap 285 is only on the source side 241 of SOI JFET, it is non-annular with respect to the channel region 240. Such a source-to-channel strap 285 provides improved link-up between the source 261 and channel 240 regions, thereby reducing the on resistance of the SOI JFET.

It should be noted that, while such a strap 285 could also be formed on the drain side 142 of the SOI JFET, it would not be advisable as it would alter the P-N junction grading. This in turn would lower the breakdown of the SOI JFET.

Additionally, it should be noted that in the embodiments shown in FIGS. 2A-B, the top gate 250, channel region 240 and bottom gate 230 can each have a same width and essentially aligned ends (e.g., the ends of the bottom gate and channel region do not extend laterally beyond the ends of the top gate) so as to prevent a path where the bottom gate 230 and top gate 250 do not effectively pinch off (i.e., deplete fully and turn off) the channel region 140. However, if the ends are not so aligned (i.e., if the ends of the bottom gate 230 extend laterally beyond the ends of the top gate 250 to, for example, the deep trench isolation region 292), then doped well regions 280 (i.e., reach-through well regions, P+ well regions) can be positioned, as shown in FIG. 2B, such that they are overlapped by both ends of the top gate 250, thereby preventing a path where the bottom gate 1230 and top gate 250 do not pinch off (i.e., deplete fully and turn off) the channel region 240. Such doped well regions 280 can further function as a bottom gate contact. Alternatively, a single gate contact configured such as the gate contact 180 in FIG. 1B discussed in detail above or the gate contact 380 in FIG. 3B below can be used. Those skilled in the art will recognize that if the bottom gate 230 is not contacted by such a gate contact, it must be separately contacted in order to apply a voltage to the bottom surface 246 of the channel region 240.

Figure 3A:
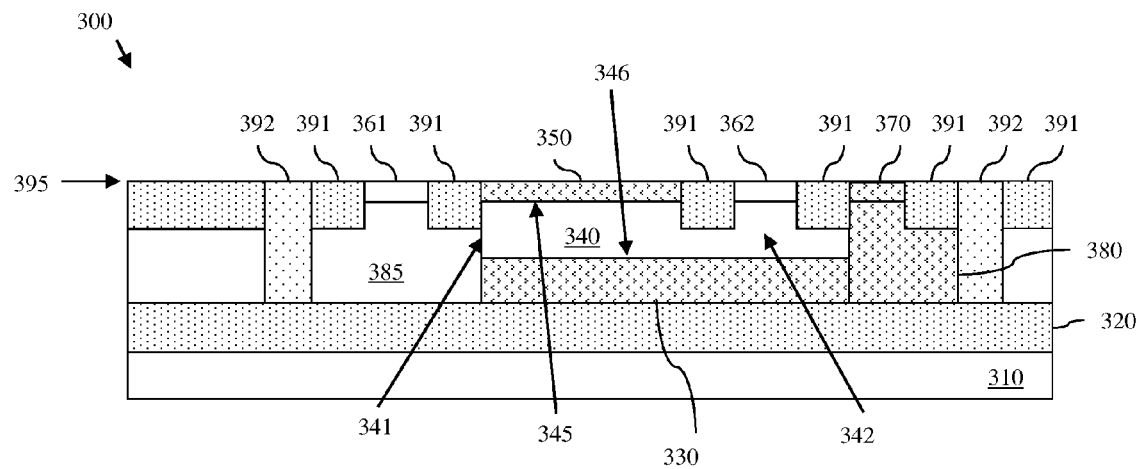
FIG. 3A is a schematic cross-section diagram illustrating a third embodiment of an asymmetric SOI JFET.
Figure 3B:
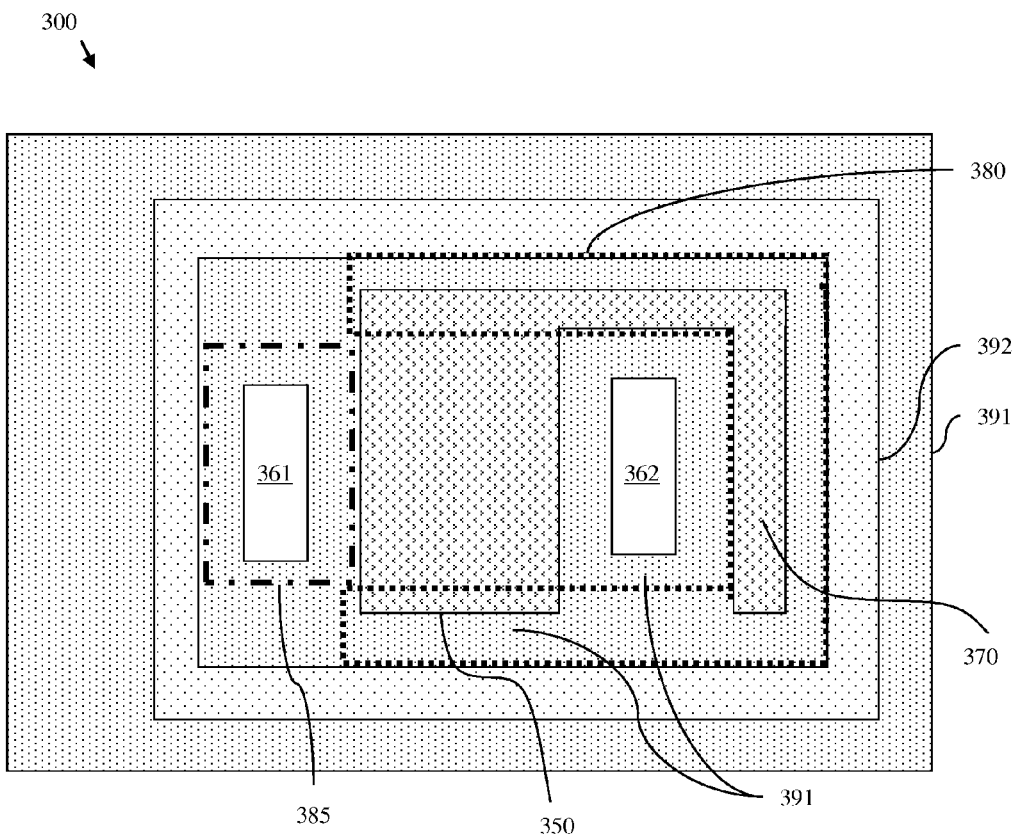
FIG. 3B is a top view diagram of the third embodiment of the asymmetric SOI JFET.

Referring in combination to the cross-section and top view diagrams, respectively, of FIGS. 3A and 3B, in yet another embodiment 300, asymmetric SOI JFET can comprise multiple non-annular well regions. For example, the embodiment 300 can comprise a source-to-channel strap 385 adjacent to the channel region 340 and bottom gate 330 on the source side 341 of the SOI JFET (e.g., similar to the strap 285 described in detail above with respect to the second embodiment 200) and also a gate contact 380 adjacent to the channel region 340 and bottom gate 330 at some other location, such as on the drain side 342 of the channel region 340 (e.g., similar to the gate contact 180 described in detail above with respect to the first embodiment 100).

As with the gate contact 180 in the first embodiment, optionally, the gate contact 380 in this third embodiment can be electrically connected to the top gate 350 by a conductive strap 370. As illustrated, this strap 370 can comprise, for example, the same doped semiconductor material that forms the top gate 350 patterned such that it extends laterally from the top gate 350 over the gate contact 380. Furthermore, the shallow trench isolation (STI) regions 391 can electrically isolate the strap 370 from the source/drain regions 361, 362. Those skilled in the art will recognize that if the gate contact 380 is not electrically connected to the top gate 350 by such a conductive strap 370, it must be separately contacted in order to apply a voltage to the bottom gate 330.

It should be noted that the following components of the different embodiments 100, 200 and 300 of the asymmetric SOI JFET (as described above and illustrated in FIGS. 1A-B, 2A-B, 3A-B) can comprise discrete dopant implant regions within a single semiconductor layer on the insulator layer (e.g., within the semiconductor layer of a semiconductor-on-insulator (SOI) wafer): the bottom gate 130, 230, 330; the channel region 140, 240, 340; the source region 161, 261, 361; the drain region 162, 262, 362; the top gate 150, 250, 350; the gate contact 180, 280, 380 and/or the source-to-channel strap 285, 385. Alternatively, these components can comprise a combination of stacked semiconductor layers and discrete dopant implant regions within the stacked semiconductor layers.

It should further be noted that in the above-described embodiments 100, 200, 300 of an asymmetric SOI JFET, the first conductivity type is referred to as a P-type conductivity and the second conductivity type is referred to as an N-type conductivity, for illustration purposes only. However, alternatively, the first conductivity type could be the N-type conductivity and the second conductivity type could be the P-type conductivity. Components described as having a P-type conductivity can be doped with a P-type conductivity dopant (e.g., a Group III dopant, such as boron (B) or indium (In)) in a predetermined concentration required to achieve the desired net conductivity, whereas components described as having an N-type conductivity can be doped with an N-type conductivity dopant (e.g., a Group V dopant, such as arsenic (As), phosphorous (P) or antimony (Sb)) in a predetermined concentration required to achieve the desired net conductivity.

Figure 4:
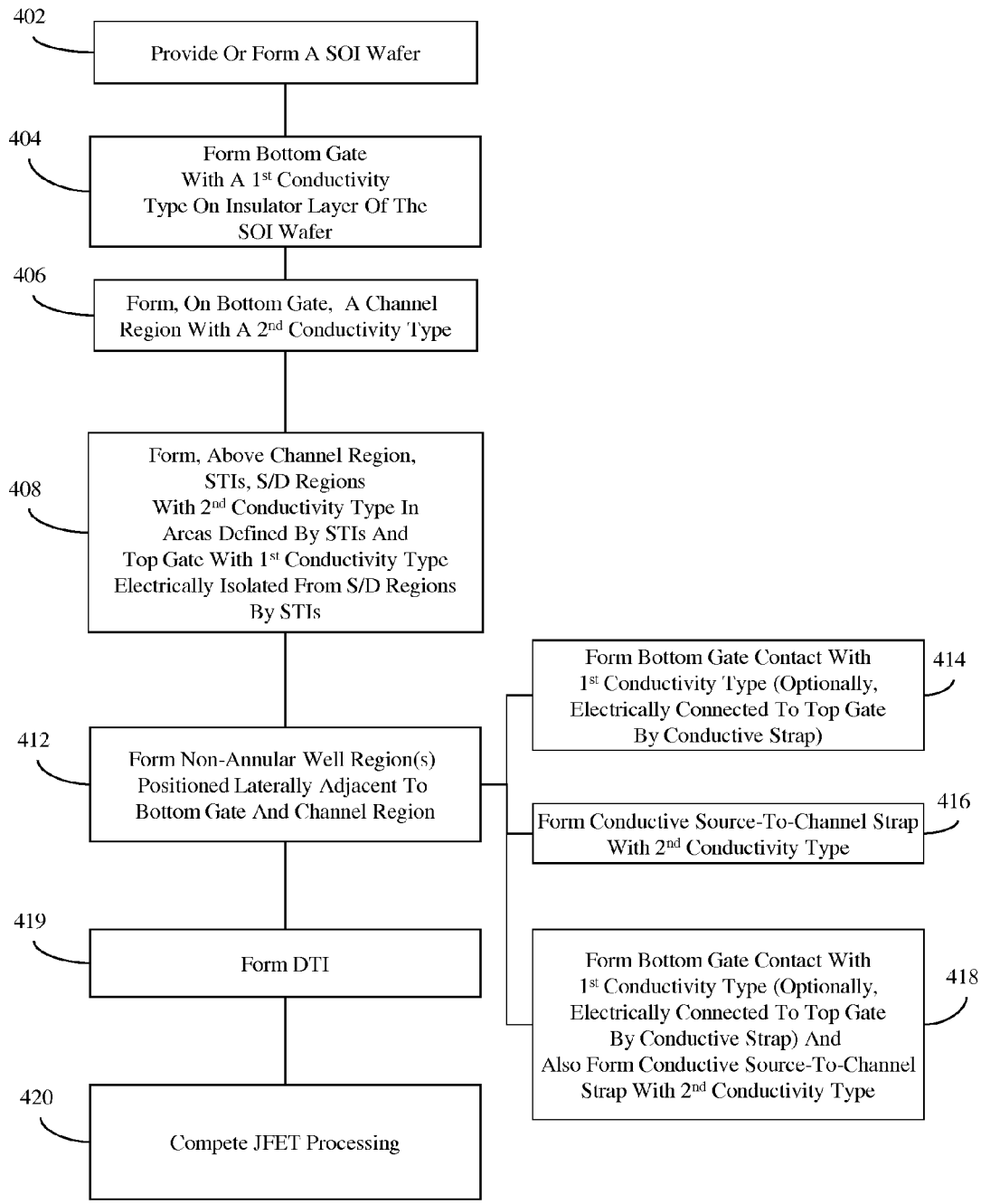
FIG. 4 is a flow diagram illustrating method embodiments for forming the asymmetric SOI JFET of FIGS. 1A-B, 2A-B and 3A-B.

Referring to FIG. 4 in combination with FIGS. 1A-B, 2A-B and 3A-B, also disclosed herein are embodiments of a method of forming the above-described embodiments 100, 200, 300 of an asymmetric silicon-on-insulator junction field effect transistor (SOI JFET).

Figure 5:
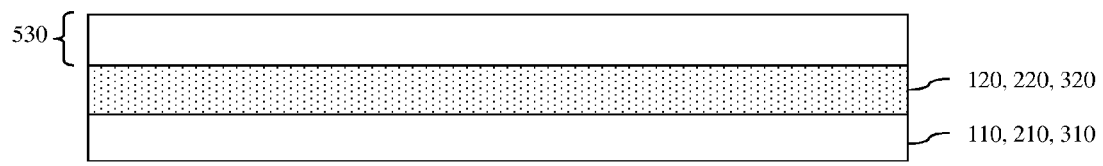
FIG. 5 is a cross-section diagram of a partially completed SOI JFET formed according to the method of FIG. 4.

Generally, the method embodiments can comprise providing or forming a semiconductor-on-insulator (SOI) wafer (402, see FIG. 5). For example, the SOI wafer can comprise a semiconductor substrate 110, 210, 310, such as a single crystalline silicon substrate with either a first conductivity type or a second conductivity type different from the first conductivity type. For example, the semiconductor substrate 110, 210, 310 can comprise P− silicon (i.e., silicon that is lightly doped with a P-type conductivity dopant). This SOI wafer can further comprise an insulator layer 120, 220, 320 on the substrate 110, 210, 310. This insulator layer 120, 220, 320 can comprise a buried dielectric layer (e.g., a buried silicon oxide (SiO$_2$) layer or BOX layer, a buried silicon nitride (SiN) layer, a buried sapphire layer, etc.). This SOI wafer can further comprise a semiconductor layer 530 (e.g., a silicon layer) on the insulator layer. Techniques for forming such SOI wafers are well-known in the art and, thus, are omitted from this specification in order to allow the reader to focus on the salient aspects of the embodiments described herein.

Figure 6:
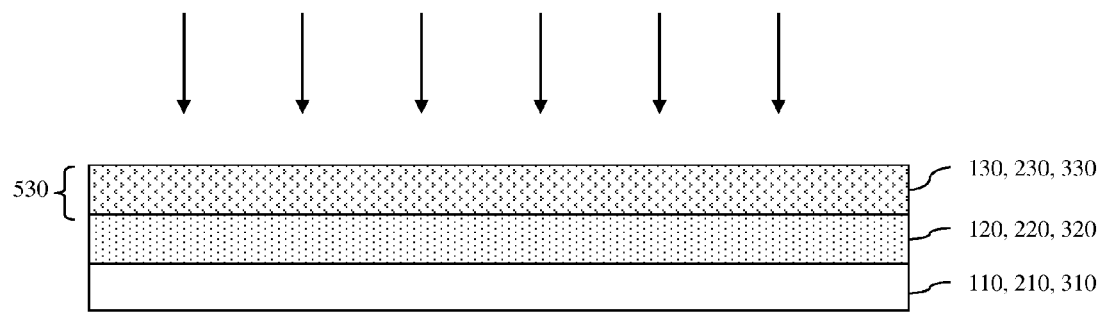
FIG. 6 is a cross-section diagram of a partially completed SOI JFET formed according to the method of FIG. 4.

Next, a bottom gate 130, 230, 330 (i.e., a first gate) can be formed on the insulator layer 120, 220, 320 of the SOI wafer (404, see FIG. 6). The bottom gate 130, 230, 330 can specifically be formed by implanting a first conductivity type dopant into the semiconductor layer 530 of the SOI wafer such that it comprises a semiconductor with a relatively high net first conductivity type. For example, a relatively high dose of a P-type conductivity dopant can be implanted into the semiconductor layer 530 to form a P+ silicon bottom gate 130, 230, 330.

Then, a channel region 140, 240, 340 can be formed on the bottom gate 130, 230, 330 (406). The channel region 140, 240, 340 can be formed either within an additional semiconductor layer 540 formed on the semiconductor layer 530 of the SOI wafer (see FIGS. 7-8 and detailed discussion below) or within the upper portion of the semiconductor layer 530 of the SOI wafer (see FIG. 9 and detailed discussion below) such that it comprises a semiconductor with a relatively low or moderate net second conductivity type that is different from the first conductivity type. For example, the channel region 140, 240, 340 can be formed such that it comprises N− or N silicon (i.e., silicon that is lightly or moderately doped with an N-type conductivity dopant).

Then, the following additional SOI JFET components can be formed on the channel region 140, 240, 340: (1) shallow trench isolation (STI) regions 191, 291, 391; (2) source and drain regions 161-162, 261-262, 361-362 within areas defined by the STI regions 191, 291, 391; and (3) a top gate 150, 250, 350 (i.e., a second gate) positioned laterally between the source and drain regions and electrically isolated from the source and drain regions 161-162, 261-262, 361-362 by the STI regions 191, 291, 391 (408, see FIGS. 10-12 and detail discussion below). Specifically, the source and drain regions 161-162, 261-262, 361-362 can be formed on the channel region 140, 240, 340 such that they each have the same conductivity type as the channel region 140, 240, 340 (i.e., the second conductivity type), but with a relatively high net conductivity (i.e., a net conductivity that is greater than that of the channel region 140, 240, 340). For example, the source and drain regions 161-162, 261-262, 361-362 can be formed such that they comprise N+ silicon or polysilicon (i.e., silicon or polysilicon that is heavily doped with an N-type conductivity dopant). The top gate 150, 250, 350 can be formed on the channel region 140, 240, 340 between and electrically isolated from the source and drain regions 161-162, 261-262, 361-362 and further such that it has the same conductivity type and essentially the same relatively high net conductivity as the bottom gate 130, 230, 330 (i.e., the first conductivity type). For example, the top gate 150, 250, 350 can be formed such that it comprises P+ silicon or polysilicon (i.e., silicon or polysilicon that is heavily doped with a P-type conductivity dopant).

It should be noted that the processes 406-408 referred to above (i.e., the process 406 of forming the channel region 140, 240, 340 and the process 408 of forming the source region 161, 261, 361, the drain region 162, 262, 362 and the top gate 150, 250, 350) can comprise performing multiple masked implant processes to create, within the single semiconductor layer 530 of the SOI wafer, multiple discrete dopant implant regions having the desired conductivity and relative positioning. Alternatively, these processes 406-408 can comprise a combination of forming stacked semiconductor layers that are optionally in-situ doped and performing multiple implant processes.

Figure 7:
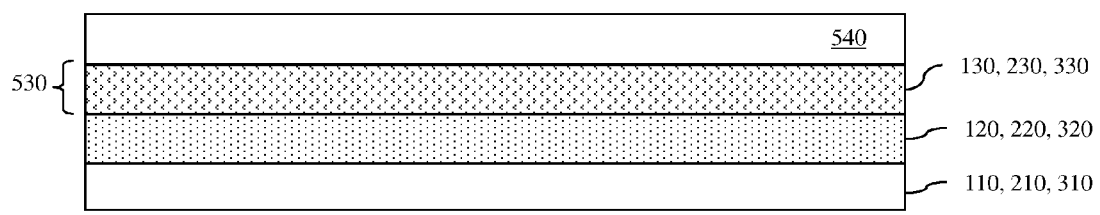
FIG. 7 is a cross-section diagram of a partially completed SOI JFET formed according to the method of FIG. 4.
Figure 8:
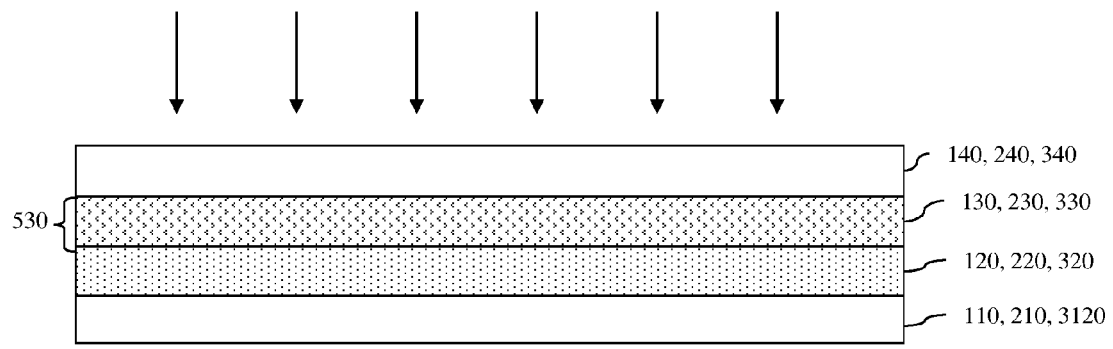
FIG. 8 is a cross-section diagram of a partially completed SOI JFET formed according to the method of FIG. 4.

For example, the process 406 of forming the channel region 140, 240, 340 on the bottom gate 130, 230, 330 can comprise forming a second discrete semiconductor layer 540 (e.g., a silicon layer) on the first semiconductor layer 530 (see FIG. 7). This second semiconductor layer 540 can be formed, for example, by epitaxial deposition or any other suitable deposition process. The second semiconductor layer 540 can be either in-situ doped with the second conductivity type dopant or, alternatively, subsequently implanted with the second conductivity type dopant (as shown in FIG. 8), thereby creating the channel region 140, 240, 340 above the bottom gate 130, 230, 330.

Figure 9:
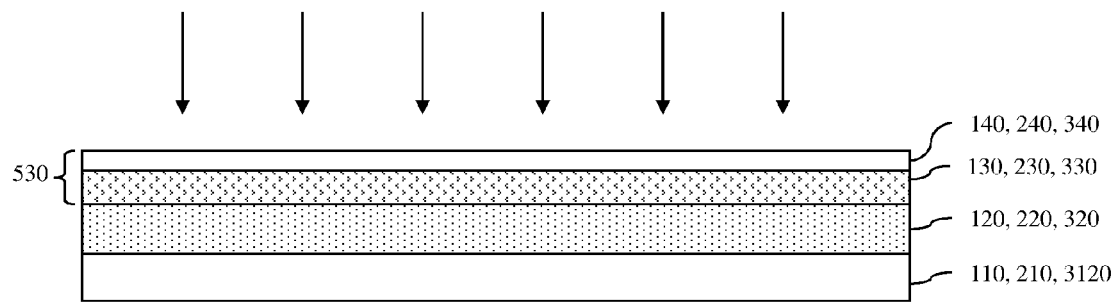
FIG. 9 is a cross-section diagram of a partially completed SOI JFET formed according to the method of FIG. 4.

However, alternatively, the process 406 of forming the channel region 140, 240, 340 can comprise simply implanting the second conductivity type dopant directly into the upper portion of the first semiconductor layer 530 (as shown in FIG. 9). Thus, the lower portion of the semiconductor layer 530 will comprise the bottom gate 130, 230, 330 and the upper portion of the semiconductor layer 530 will comprise the channel region 140, 240, 340. For illustration purposes, the remaining processes are illustrated following channel region formation as shown in FIG. 8. It should, however, be understood that these same processes could alternatively be performed following channel region formation as shown in FIG. 9.

As mentioned above, process 408 involves forming the following SOI JFET components: (1) shallow trench isolation (STI) regions 191, 291, 391; (2) source and drain regions 161-162, 261-262, 361-362 within areas defined by the STI regions 191, 291, 391; (3) a top gate 150, 250, 350 (i.e., a second gate) positioned laterally between the source and drain regions and electrically isolated from the source and drain regions 161-162, 261-262, 361-362 by the STI regions 191, 291, 391; and (4) the optional conductive strap 170, 370 for electrically connecting the gate contact 180, 380 and top gate 150, 350.

Figure 10:
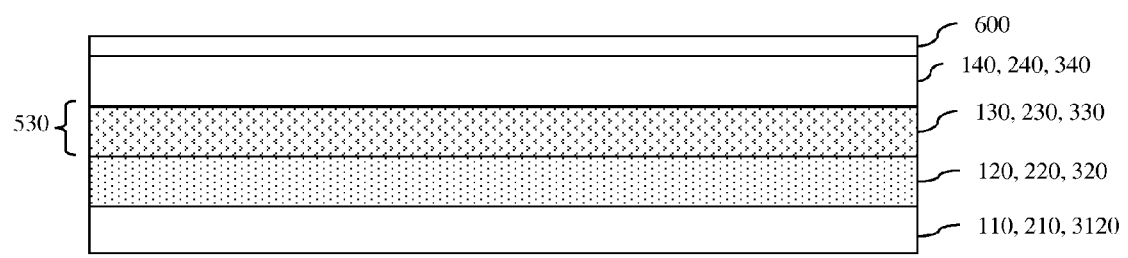
FIG. 10 is a cross-section diagram of a partially completed SOI JFET formed according to the method of FIG. 4.
Figure 11:
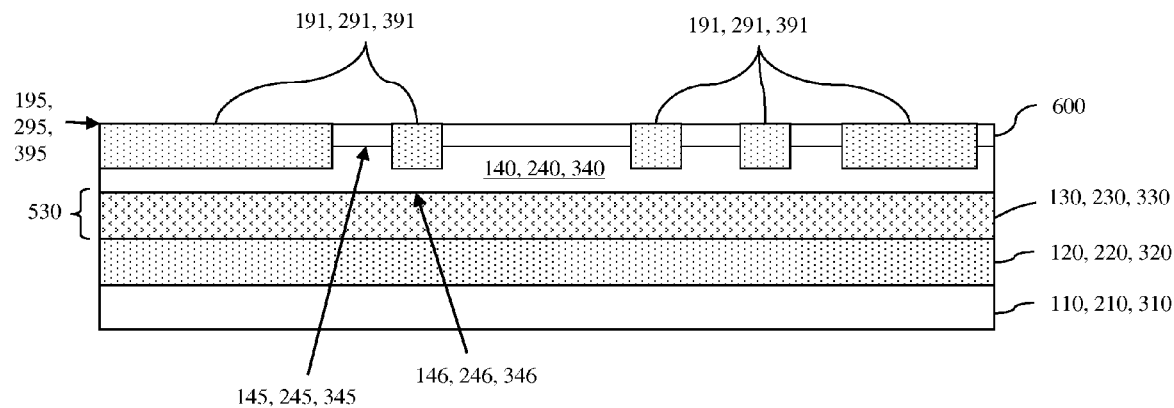
FIG. 11 is a cross-section diagram of a partially completed SOI JFET formed according to the method of FIG. 4.

To do this first a third semiconductor layer 600 (e.g., a silicon layer or a polysilicon layer) is formed on the channel region 140, 240, 340 (see FIG. 10). This third semiconductor layer 600 can be formed, for example, by epitaxial deposition or any other suitable deposition process. After the third semiconductor layer 600 is formed, STIs 191, 291, 391 can be formed, as described above, defining portions of the third semiconductor layer 600 that will form the source region, drain region, top gate and, optional, conductive strap (see FIG. 11). The STI structures 191, 291, 391 can be formed using conventional STI formation techniques. For example, relatively shallow trenches extending from the top surface 195, 295, 395 of the structure down to at least the top surface 145, 245, 345 of the channel region 140, 240, 340, but preferably not as deep as the bottom surface 146, 246, 346, of the channel region 140, 240, 340. These shallow trenches can then be lined (optionally) and filled with one or more isolation materials (e.g., a silicon oxide material, a silicon nitride material, a silicon oxynitride material or any other suitable isolation material). Techniques for forming such STI structures are well-known in the art and, thus, are omitted from this specification in order to allow the reader to focus on the salient aspects of the embodiments described herein.

Figure 12:
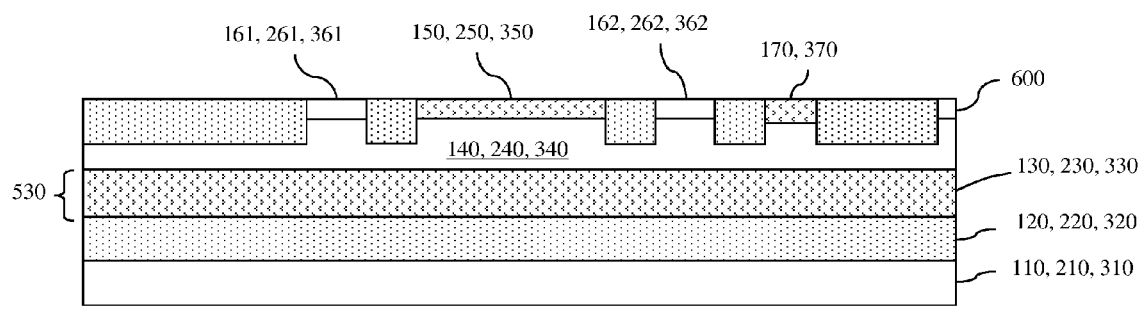
FIG. 12 is a cross-section diagram of a partially completed SOI JFET formed according to the method of FIG. 4.

Either subsequent masked implant processes alone or a combination of in-situ doping during formation of the third semiconductor layer 600 and subsequent masked implant processes can be used to achieve different conductivity types in different portions of the third semiconductor layer in order to create, at process 408, the top gate 150, 250, 350, the optional strap 170, 370, and the source and drain regions 161-162, 261-262, 361-362 within areas defined by the STI structures 191, 291, 391 (see FIG. 12). That is, first portions of the third semiconductor layer 600 can be doped with a second conductivity type dopant to form the source and drain regions 161-162, 261-262, 361-362 above the channel region 140, 240, 340. Additionally, a second portion of the third semiconductor layer can be doped with a first conductivity type dopant to form the top gate 150, 250, 350 above the channel region 140, 240, 340 and positioned laterally between the source and drain regions 161-162, 261-262, 361-362. Optionally, as the second portion of the third semiconductor layer 600 is being doped with the first conductivity type dopant to form the top gate 150, 350, a third portion of the third semiconductor layer 600 can also be doped so as to form a conductive strap 170, 370 in order to electrically contact the top gate 150, 350 with a gate contact 180, 380, which will subsequently be formed (at process 414 or 418), respectively.

It should be noted that the techniques used for masked implant processes and semiconductor deposition processes (e.g., epitaxial deposition processes, in-situ doped epitaxial deposition processes, etc.) are well known in the art and, thus, the details of such processes are omitted from the specification in order to allow the reader to focus on the salient aspects of the embodiments described herein.

Additionally, the method embodiments can further comprise forming one or more non-annular well regions positioned adjacent to the channel region 140, 240, 340 and bottom gate 130, 230, 330, thereby creating the asymmetric configuration (412).

Figure 13:
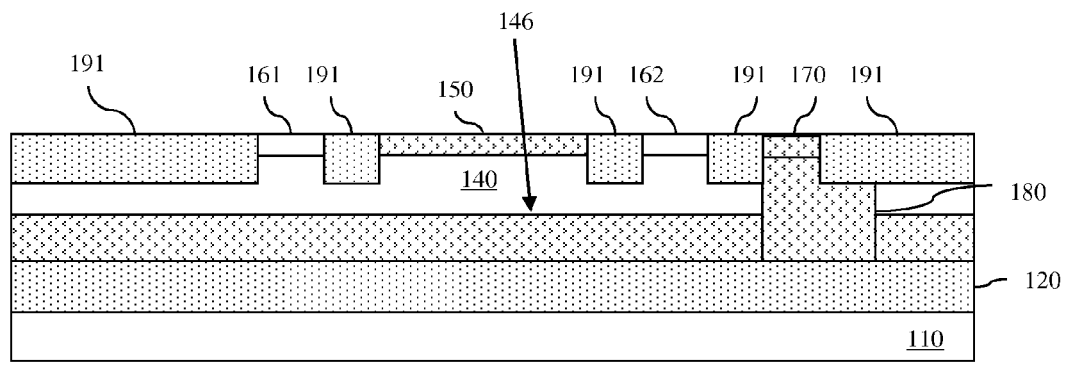
FIG. 13 is a cross-section diagram of a partially completed SOI JFET formed according to the method of FIG. 4 specifically to achieve the SOI JFET structure shown in FIGS. 1A-B.

Specifically, in one embodiment, the method can further comprise forming a gate contact 180 (i.e., a reach-through contact region or sinker contact region) (414, see FIG. 13). This gate contact 180 can be formed, for example, using a conventional masked implant process, to create a well region (i.e. a deep dopant implant region) having the same conductivity type as the bottom and top gates 130, 150 (i.e., the first conductivity type) and also having essentially the same net conductivity as the bottom and top gates 130, 150 (e.g., a P+ well region). The implant process can further be tailored so that the resulting well region extends vertically down through the channel region 140 to at least the bottom gate 130 and, preferably, down through the channel region 140 and bottom gate 130 to the insulator layer 120. This implant process can further be tailored so that the resulting well region is non-annular with respect to the channel region 140. That is, it can be tailored such that the resulting well region is positioned adjacent to only a portion of the channel region 140 (e.g., on the source side 141 only of the SOI JFET or on the drain side 142 only of the SOI JFET, as shown) rather than laterally surrounding the entire channel region 140. Such a non-annular gate contact 180 provides a trade-off between the advantages of having a wrapped gate JFET and a lower resistance contact to the bottom gate with the disadvantage of having relatively large lateral dimensions.

It should be noted that, during the above described processes, the top gate 150, channel region 140 and bottom gate 130 can each be formed such that they have a same width and further such that they are essentially aligned ends (e.g., such that the ends of the bottom gate and channel region do not extend laterally beyond the ends of the top gate) so as to prevent a path where the bottom gate 130 and top gate 150 do not effectively pinch off (i.e., deplete fully and turn off) the channel region 140. However, if the ends are not so aligned (i.e., if the ends of the bottom gate 130 extend laterally beyond the ends of the top gate 150 to, for example, the deep trench isolation region 192), then the gate contact 180 (i.e., the P+ well region) can further be formed, as shown in FIG. 1B, such that, in the final structure, it will be overlapped by both ends of the top gate 150, thereby preventing a path where the bottom gate 130 and top gate 150 do not pinch off (i.e., deplete fully and turn off) the channel region 140.

It should further be noted that, during formation of the top gate 150 at process 408, the same doped semiconductor material can be patterned to form a conductive strap 170 that will electrically connect the gate contact 180 formed at process 414 to the top gate 150. As illustrated, this conductive strap 170 can be formed so that in the resulting SOI JFET it extends laterally from the top gate 150 over the gate contact 180. Those skilled in the art will recognize that if the gate contact 180 is not electrically connected to the top gate 150 by such a conductive strap 170, a separate contact to the gate contact 180 must be formed in order to apply a voltage to the bottom gate 130. Additionally, during formation of the STI structures 191 at process 408, the STI structures 191 can also be formed in order to electrically isolate the conductive strap 170 from the source/drain regions 161, 162.

Figure 14:
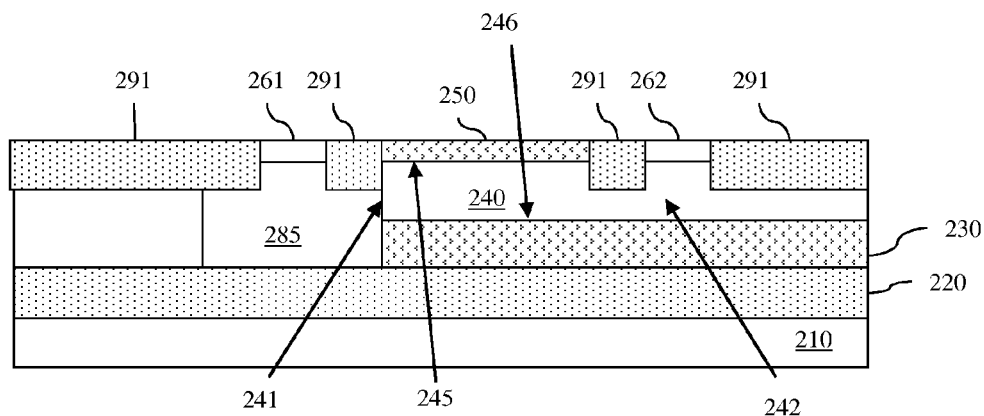
FIG. 14 is a cross-section diagram of a partially completed SOI JFET formed according to the method of FIG. 4 specifically to achieve the SOI JFET structure shown in FIGS. 2A-B.

In another embodiment, the method can further comprise forming a source-to-channel strap 285 (416, see FIG. 14). This source-to-channel strap 285 can be formed, for example, using a conventional masked implant process, to create a well region (i.e., a deep dopant implant region) having the same conductivity type as the source 261 and channel 240 regions (i.e., the second conductivity type) and having essentially the same net conductivity as the source region 261 (e.g., an N+ well region). The implant process can be tailored so that the source-to-channel strap 285 extends vertically from the source region 261 down through the channel region 240 to at least the bottom gate 230 and, preferably, down through the channel region 240 and bottom gate 230 to the insulator layer 220. Since the strap 285 is formed at process 416 only on the source side 241 of the SOI JFET, it is formed such that it is non-annular with respect to the channel region 240. Such a strap 285 provides improved link-up between the source 261 and channel 240 regions, thereby reducing the on resistance of the SOI JFET. It should be noted that, while such a strap 285 could also be formed on the drain side 142 of the SOI JFET, it would not be advisable as it would alter the P-N junction grading. This in turn would lower the breakdown of the SOI JFET.

Additionally, it should be noted that, during the process steps described above, the top gate 250, channel region 240 and bottom gate 230 can each be formed so that they have a same width and essentially aligned ends (e.g., the ends of the bottom gate and channel region do not extend laterally beyond the ends of the top gate) so as to prevent a path where the bottom gate 230 and top gate 250 do not effectively pinch off (i.e., deplete fully and turn off) the channel region 140. However, if the ends are not so aligned (i.e., if the ends of the bottom gate 230 extend laterally beyond the ends of the top gate 250 to, for example, the deep trench isolation region 292), an additional implant process can be performed so as to formed doped well regions 280 (i.e., reach-through well regions, P+well regions) positioned, as shown in FIG. 2B, such that, in the resulting structure, they are overlapped by both ends of the top gate 250, thereby preventing a path where the bottom gate 1230 and top gate 250 do not pinch off (i.e., deplete fully and turn off) the channel region 240. Such doped well regions 280 can further function as a bottom gate contact. Alternatively, this additional dopant implant process can be used to form a single gate contact configured such as the gate contact 180 in FIG. 1B discussed in detail above or the gate contact 380 in FIG. 3B below can be used. Those skilled in the art will recognize that if the bottom gate 230 is not contacted by such a gate contact, it must be separately contacted in order to apply a voltage to the bottom surface 246 of the channel region 240.

Figure 15:
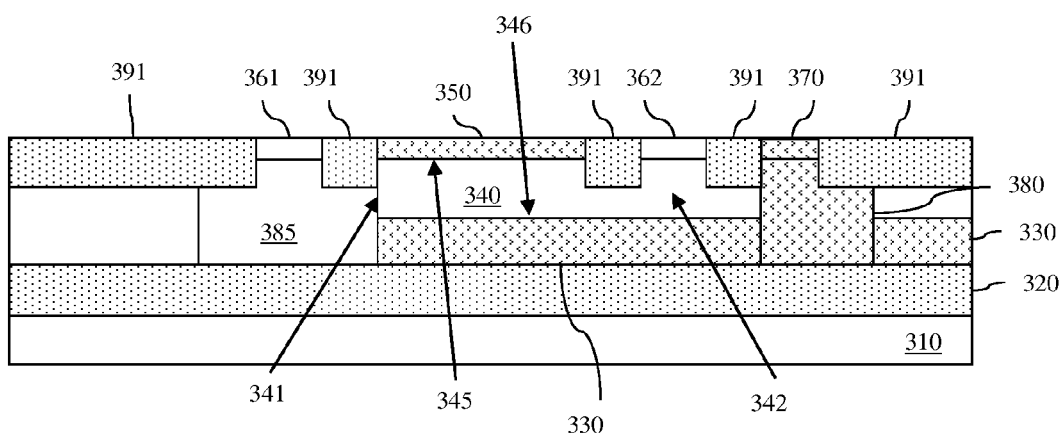
FIG. 15 is a cross-section diagram of a partially completed SOI JFET formed according to the method of FIG. 4 specifically to achieve the SOI JFET structure shown in FIGS. 3A-B.

In yet another embodiment, the method can further comprise forming a source-to-channel strap 385 (e.g., similar to the strap 285 as described in detail above with respect to the second method embodiment) adjacent to the channel region 340 and bottom gate 330 on the source side 341 of the SOI JFET and also a gate contact 380 (e.g., similar to the gate contact 180 as described in detail above with respect to the first method embodiment) adjacent to the channel region 340 and bottom gate 330 at some other location (e.g., on the drain side 342 of the SOI JFET) (418, see FIG. 15).

It should be noted that the techniques used for masked implant processes are well known in the art and, thus, the details of such processes are omitted from the specification in order to allow the reader to focus on the salient aspects of the embodiments described herein. Additionally, for illustration purposes, these non-annular well regions are described above as being formed at process 412 following source and drain region formation at process 408. However, it should be noted that alternatively such well regions could be formed at an earlier point in the SOI JFET processing (e.g., prior to source and drain region formation at process 408).

Following the processes described above, an annular deep trench isolation (DTI) structure 192, 292, 392 (i.e., a second trench isolation structure) can be formed on the insulator layer 120, 220, 320 (419, see FIGS. 1A, 2A and 3A). Specifically, conventional DTI formation techniques can be used to form a DTI structure 192, 292, 392 that laterally surrounds the resulting asymmetric SOI JFET 100, 200, 300 and, thereby electrically isolates it from other devices on the substrate 110, 210, 310. For example, the annular DTI structure 192, 292, 392 can be formed by first forming a relatively deep trench extending from the top surface 195, 295, 395 of the structure 100, 200, 300 through the outer STI regions 191, 291, 391 down to the insulator layer 120, 220, 320. The DTI trench can then be lined (optionally) and filled with one or more isolation materials (e.g., a silicon oxide material, a silicon nitride material, a silicon oxynitride material or any other suitable isolation material). Techniques for forming such DTI structures are well-known in the art and, thus, are omitted from this specification in order to allow the reader to focus on the salient aspects of the embodiments described herein. For illustration purposes, this DTI structure is described as being formed at process 419 just prior to completion of the SOI JFET structure. However, it should be noted that alternatively such well regions could be formed early in the SOI FET processing (e.g., at the same time as STI formation at process 408).

Finally, additional conventional SOI JFET processing can be performed in order to complete the asymmetric SOI JFET structure 100, 200, 300 (420). This processing can include, but is not limited to, silicide formation, interlayer dielectric deposition, contact formation, etc. Such processing techniques are well-known in the art and, thus, the details of such processing techniques are omitted from this specification in order to allow the reader to focus on the salient aspects of the embodiments described herein.

It should be noted that in the above-described processes, the first conductivity type is referred to as a P-type conductivity and the second conductivity type is referred to as an N-type conductivity, for illustration purposes only. However, alternatively, the first conductivity type could be the N-type conductivity and the second conductivity type could be the P-type conductivity. Additionally, it should be understood that in the above described processes, components described as being formed with a P-type conductivity can be doped with a P-type conductivity dopant (e.g., a Group III dopant, such as boron (B) or indium (In)) in a predetermined concentration required to achieve the desired net conductivity, whereas components described as being formed with an N-type conductivity can be doped with an N-type conductivity dopant (e.g., a Group V dopant, such as arsenic (As), phosphorous (P) or antimony (Sb)) in a predetermined concentration required to achieve the desired net conductivity.

Figure 16:
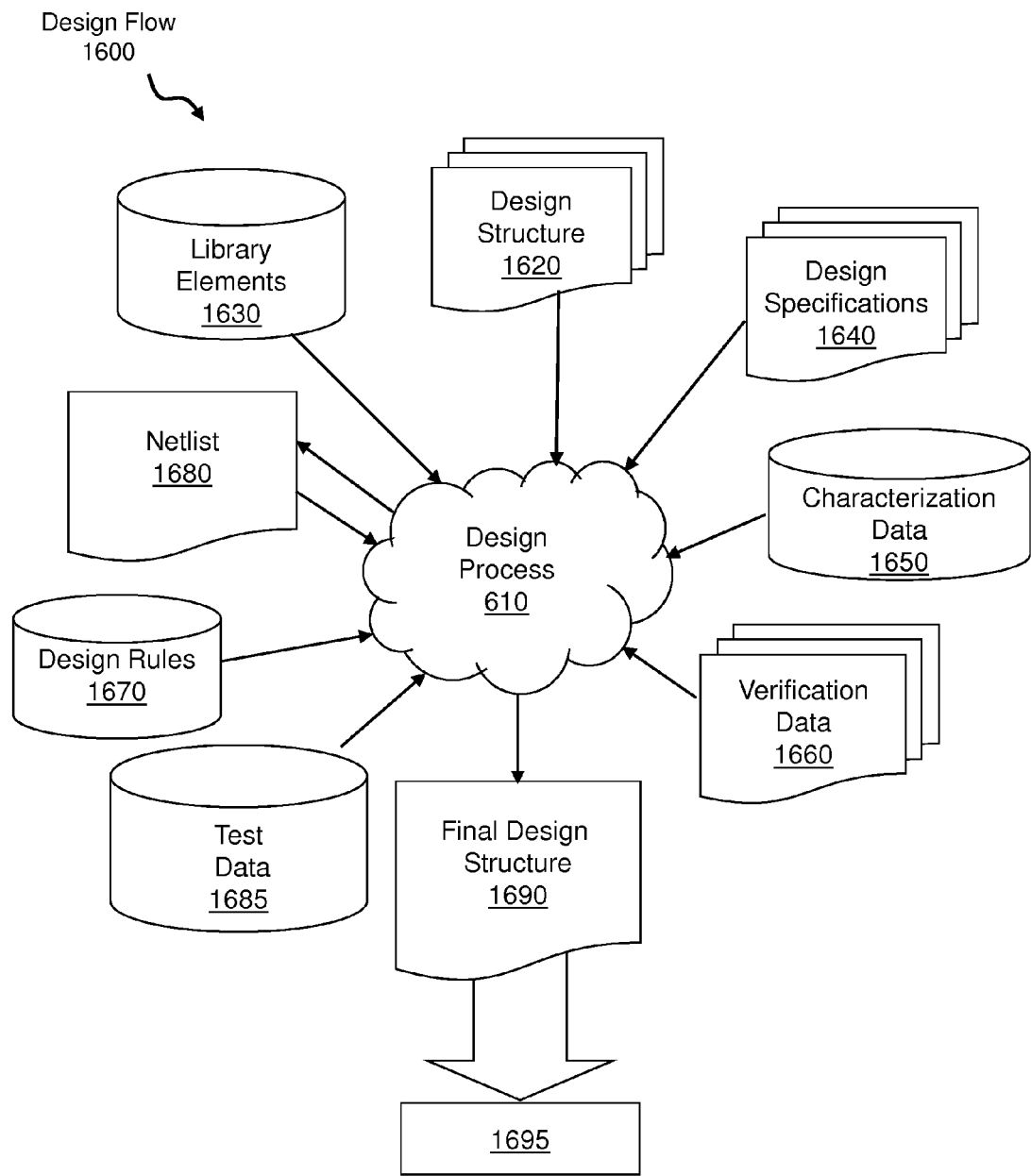
FIG. 16 is a flow diagram of a design process used in semiconductor design, manufacture, and/or test.

Also disclosed herein are embodiments of a design structure of the above described asymmetric SOI JFET structures. Specifically, FIG. 16 shows a block diagram of an exemplary design flow 1600 used for example, in semiconductor IC logic design, simulation, test, layout, and manufacture. Design flow 1600 includes processes, machines and/or mechanisms for processing design structures or devices to generate logically or otherwise functionally equivalent representations of the design structures and/or devices described above and shown in FIGS. 1A-B, 2A-B and 3A-B. The design structures processed and/or generated by design flow 1600 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 1600 may vary depending on the type of representation being designed. For example, a design flow 1600 for building an application specific IC (ASIC) may differ from a design flow 1600 for designing a standard component or from a design flow 1600 for instantiating the design into a programmable array, for example a programmable gate array (PGA) or a field programmable gate array (FPGA) offered by Altera® Inc. or Xilinx® Inc.

FIG. 16 illustrates multiple such design structures including an input design structure 1620 that is preferably processed by a design process 1610. Design structure 1620 may be a logical simulation design structure generated and processed by design process 1610 to produce a logically equivalent functional representation of a hardware device. Design structure 1620 may also or alternatively comprise data and/or program instructions that when processed by design process 1610, generate a functional representation of the physical structure of a hardware device. Whether representing functional and/or structural design features, design structure 1620 may be generated using electronic computer-aided design (ECAD) such as implemented by a core developer/designer. When encoded on a machine-readable data transmission, gate array, or storage medium, design structure 1620 may be accessed and processed by one or more hardware and/or software modules within design process 1610 to simulate or otherwise functionally represent an electronic component, circuit, electronic or logic module, apparatus, device, or system such as those shown in FIGS. 1A-B, 2A-B and 3A-B. As such, design structure 1620 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1610 preferably employs and incorporates hardware and/or software modules for synthesizing, translating, or otherwise processing a design/simulation functional equivalent of the components, circuits, devices, or logic structures shown in FIGS. 1A-B, 2A-B and 3A-B to generate a netlist 1680 which may contain design structures such as design structure 1620. Netlist 1680 may comprise, for example, compiled or otherwise processed data structures representing a list of wires, discrete components, logic gates, control circuits, I/O devices, models, etc. that describes the connections to other elements and circuits in an integrated circuit design. Netlist 1680 may be synthesized using an iterative process in which netlist 1680 is resynthesized one or more times depending on design specifications and parameters for the device. As with other design structure types described herein, netlist 1680 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1610 may include hardware and software modules for processing a variety of input data structure types including netlist 1680. Such data structure types may reside, for example, within library elements 1630 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1640, characterization data 1650, verification data 1660, design rules 1670, and test data files 1685 which may include input test patterns, output test results, and other testing information. Design process 1610 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1610 without deviating from the scope and spirit of the invention. Design process 1610 may also include modules for performing standard circuit design processes such as timing analysis, verification, design rule checking, place and route operations, etc.

Design process 1610 employs and incorporates logic and physical design tools such as HDL compilers and simulation model build tools to process design structure 1620 together with some or all of the depicted supporting data structures along with any additional mechanical design or data (if applicable), to generate a second design structure 1690. Design structure 1690 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 1620, design structure 1690 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1A-B, 2A-B and 3A-B. In one embodiment, design structure 1690 may comprise a compiled, executable HDL simulation model that functionally simulates the devices shown in FIGS. 1A-B, 2A-B and 3A-B.

Design structure 1690 may also employ a data format used for the exchange of layout data of integrated circuits and/or symbolic data format (e.g. information stored in a GDSII (GDS2), GL1, OASIS, map files, or any other suitable format for storing such design data structures). Design structure 1690 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1A-B, 2A-B and 3A-B. Design structure 1690 may then proceed to a stage 1695 where, for example, design structure 1690: proceeds to tape-out, is released to manufacturing, is released to a mask house, is sent to another design house, is sent back to the customer, etc.

Figure 17:
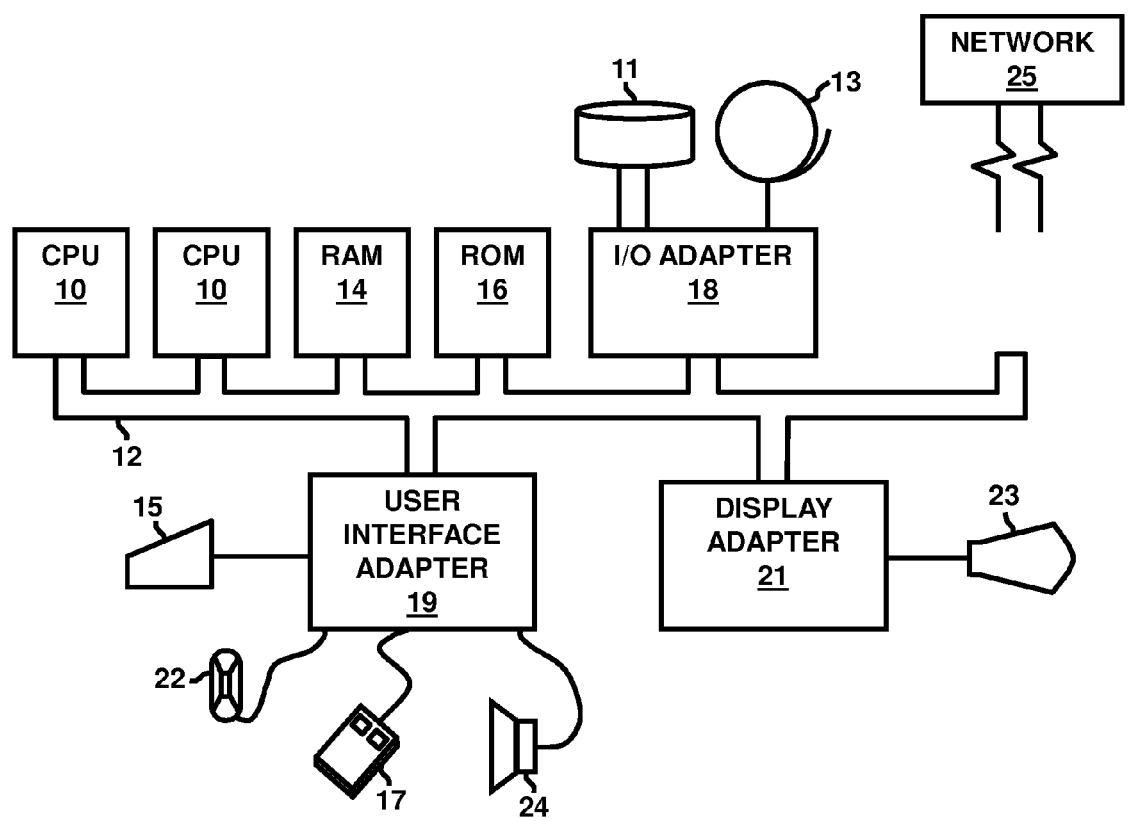
FIG. 17 is a schematic diagram illustrating an exemplary hardware environment that can be used to implement the design flow of FIG. 16.

A representative hardware environment for implementing the design flow described above is depicted in FIG. 17. This schematic drawing illustrates a hardware configuration of an information handling/computer system. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the descriptive information, including the inventive instructions, encoded on the design structures and follow these instructions to execute the methodology of the embodiments of the invention. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

It should be noted that the terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Therefore, disclosed above are embodiments of an asymmetric semiconductor-on-insulator junction field effect transistor (SOI JFET). The asymmetric SOI JFET comprises an insulator layer on a substrate, a bottom gate on the insulator layer, a channel region on the bottom gate and, on the channel region, source/drain regions and a top gate positioned laterally between the source/drain regions. Shallow trench isolation structures (STIs) electrically isolate the source/drain regions from the top gate and a deep trench isolation structure (DTI) laterally surrounds the JFET structure to electrically isolate it from other devices on the substrate. One or more non-annular well regions can be positioned laterally adjacent to the channel region within the confines of the DTI, thereby creating the asymmetric configuration. For example, a well region having the same conductivity type as the top and bottom gates can extend vertically down through the channel region to the bottom gate and, preferably, through the channel region and bottom gate to the insulator layer so as form a gate contact on only one side of the JFET structure. Such a non-annular gate contact provides a trade-off between the advantages of having a wrapped gate JFET and a lower resistance contact to the bottom gate with the disadvantage of having relatively large lateral dimensions. Additionally or alternatively, another well region having the same conductivity type as the channel region and as the source/drain regions can extend vertically from the source region down through the channel region to the bottom gate and, preferably, through the channel region and the bottom gate to the insulator layer so as to form a source-to-channel strap. Such a strap provides improved link-up between the source and channel regions. Also disclosed are method embodiments for forming the above-described asymmetric SOI JFET embodiments.

What is claimed is:

1. An asymmetric junction field effect transistor structure comprising:
   a first gate on an insulator layer above a semiconductor substrate, said first gate having a first conductivity type;
   a single channel region having a bottom surface adjacent to said first gate, said channel region further having a top surface, a first side, a second side opposite said first side, and a second conductivity type different from said first conductivity type;
   a source region on said top surface of said channel region at said first side, said source region having said second conductivity type;
   a drain region on said top surface of said channel region at said second side, said drain region having said second conductivity type;
   a second gate on said top surface of said channel region and positioned laterally between said source region and said drain region, said second gate having said first conductivity type;
   a trench isolation structure laterally surrounding said channel region and said first gate, extending vertically to said insulator layer, and being in contact with said first side of said channel region; and,
   a gate contact positioned laterally between said second side of said channel region and said trench isolation structure such that said second side of said channel region is physically separated from said trench isolation structure and, thereby such that said asymmetric junction field effect transistor is asymmetric, said gate contact extending vertically down to said insulator layer and said gate contact having said first conductivity type.

2. The asymmetric junction field effect transistor structure of claim 1, further comprising:
   additional trench isolation structures on said channel region and laterally surrounding said source region and said drain region so as to electrically isolate said source region and said drain region from said second gate,
   said trench isolation structure electrically isolating said asymmetric junction field effect transistor from other devices on said substrate.

3. The asymmetric junction field effect transistor structure of claim 1, said first gate, said channel region, said source region, said drain region, said second gate and said gate contact comprising any one of the following:
   discrete dopant implant regions within a single semiconductor layer on said insulator layer; and
   a combination of stacked semiconductor layers and discrete dopant implant regions within said stacked semiconductor layers.

4. The asymmetric junction field effect transistor structure of claim 1, further comprising a source-to-channel strap on a different side of said asymmetric junction field effect transistor structure than said gate contact, said source-to-channel strap having said second conductivity type and extending vertically from said source region down through said channel region to at least said first gate.

5. An asymmetric junction field effect transistor structure comprising:
   a first gate on an insulator layer above a semiconductor substrate, said first gate having a first conductivity type;
   a single channel region having a bottom surface adjacent to said first gate, said channel region further having a top surface, a first side, a second side opposite said first side, and a second conductivity type different from said first conductivity type;
   a source region adjacent to said channel region at said first side, said source region having said second conductivity type;
   a drain region on said top surface of said channel region at said second side, said drain region having said second conductivity type;
   a second gate on said top surface of said channel region and positioned laterally between said source region and said drain region, said second gate having said first conductivity type;
   a trench isolation structure laterally surrounding said channel region and said first gate, extending vertically to said insulator layer, and being in contact with said second side of said channel region; and,
   a source-to-channel strap having said second conductivity type at a higher conductivity level than said channel region and extending vertically from said source region to said insulator layer, said source-to-channel strap being positioned laterally between and in contact with said first side of said channel region and said trench isolation structure such that said first side of said channel is electrically connected to said source region and physically separated from said trench isolation structure and, thereby such that said asymmetric junction field effect transistor is asymmetric.

6. The asymmetric junction field effect transistor structure of claim 5, further comprising:
   additional trench isolation structures on said channel region and laterally surrounding said source region and said drain region so as to electrically isolate said source region and said drain region from said second gate, said trench isolation structure electrically isolating said asymmetric junction field effect transistor from other devices on said substrate.

7. The asymmetric junction field effect transistor structure of claim 5, said first gate, said channel region, said source region, said drain region, said second gate and said source-to-channel strap comprising any one of the following:
   discrete dopant implant regions within a single semiconductor layer on said insulator layer; and
   a combination of stacked semiconductor layers and discrete dopant implant regions within said stacked semiconductor layers.

8. The asymmetric junction field effect transistor structure of claim 5, further comprising a gate contact on a different side of said asymmetric junction field effect transistor than said source-to-channel strap, said gate contact extending vertically through said channel region down to at least said first gate.

9. A method of forming an asymmetric junction field effect transistor structure, said method comprising:
   forming, on an insulator layer above a semiconductor substrate, a first gate having a first conductivity type;
   forming, on said first gate, a channel region having a bottom surface adjacent to said first gate and further having a top surface, a first side, a second side opposite said first side, and a second conductivity type different from said first conductivity type;
   forming, on said top surface of said channel region, a source region at said first side and having said second conductivity type, a drain region at said second side and having said second conductivity type, and a second gate positioned laterally between said source region and said drain region and having said first conductivity type; and,
   forming a gate contact and forming a trench isolation structure such that said asymmetric junction field effect transistor is asymmetric,
   said forming of said gate contact comprising forming said gate contact having said first conductivity type such that said gate contact is positioned laterally adjacent to said second side of said channel region and said first gate and extends vertically down to said insulator layer, and
   said forming of said trench isolation structure comprising forming said trench isolation structure laterally surrounding said channel region and said first gate, extending vertically to said insulator layer, being in contact with said first side of said channel region and further being positioned such that said gate contact is positioned laterally between said second side of said channel region and said trench isolation structure.

10. The method of claim 9, further comprising:
   before said forming of said source region, said drain region and said second gate, forming additional trench isolation structures that will laterally surround said source region and said drain region and, thereby electrically isolate said source region and said drain region from said second gate, said trench isolation structure electrically isolating said asymmetric junction field effect transistor from other devices on said substrate.

11. The method of claim 9, said first gate, said channel region, said source region, said drain region, said second gate and said gate contact being formed by forming discrete dopant implant regions within a single semiconductor layer on said insulator layer.

12. The method of claim 9,
   said forming of said first gate comprising forming said first gate in a first semiconductor layer on said insulator layer;
   said forming of said channel region comprising forming a second semiconductor layer on said first semiconductor layer and forming said channel region in said second semiconductor layer above said first gate;
   said forming of said source region, said drain region and said second gate comprising:
      forming a third semiconductor layer on said second semiconductor layer;
      doping first portions of said third semiconductor layer with a second conductivity type dopant to form said source region and said drain region above said channel region;
      doping a second portion of said third semiconductor layer with a first conductivity type dopant to form said second gate above said channel region and positioned laterally between said source region and said drain region; and
   said forming of said gate contact comprising forming a dopant implant region in said second semiconductor layer adjacent to and abutting said second side of said channel region.

13. The method of claim 12, further comprising, during said doping of said second portion, further doping a third portion of said third semiconductor layer with said first conductivity type dopant such that said third portion extends laterally from at least one side of said second portion to said gate contact.

14. The method of claim 9, further comprising forming a source-to-channel strap on a different side of said asymmetric junction field effect transistor structure than said gate contact, said source-to-channel strap having said second conductivity type and extending vertically from said source region down through said channel region to at least said first gate.

15. A method of forming an asymmetric junction field effect transistor structure, said method comprising:
   forming, on an insulator layer above a semiconductor substrate, a first gate having a first conductivity type;
   forming, on said first gate, a channel region having a bottom surface adjacent to said first gate and further having a top surface, a first side, a second side opposite said first side, and a second conductivity type different from said first conductivity type;
   forming, adjacent to said channel region, a source region at said first side and having said second conductivity type, a drain region on said top surface at said second side and having said second conductivity type, and a second gate on said top surface, positioned laterally between said source region and said drain region and having said first conductivity type; and
   forming a source-to-channel strap and forming a trench isolation structure such that said asymmetric junction field effect transistor is asymmetric,
      said forming of said source-to-channel strap comprising forming said source-to-channel strap having said second conductivity type at a higher conductivity level than said channel region and extending vertically from said source region to said insulator layer, said source-to-channel strap being positioned laterally adjacent to and in contact with said first side of said channel region so as to electrically connect said source region to said channel region, and
      said forming of said trench isolation structure comprising forming said trench isolation structure laterally surrounding said channel region and said first gate, extending vertically to said insulator layer, being in contact with said second side of said channel and further being positioned such that said source-tochannel strap is positioned laterally between said first side of said channel region and said trench isolation structure.

16. The method of claim 15, further comprising:
before said forming of said source region, said drain region and said second gate, forming additional trench isolation structures that will laterally surround said source region and said drain region and, thereby electrically isolate said source region and said drain region from said second gate, said trench isolation structure electrically isolating said asymmetric junction field effect transistor from other devices on said substrate.

17. The method of claim 15, said first gate, said channel region, said source region, said drain region, said second gate and said source-to-channel strap being formed by forming discrete dopant implant regions within a single semiconductor layer on said insulator layer.

18. The method of claim 15,
said forming of said first gate comprising forming said first gate in a first semiconductor layer on said insulator layer;
said forming of said channel region comprising forming a second semiconductor layer on said first semiconductor layer and forming said channel region in said second semiconductor layer above said first gate;
said forming of said source region, said drain region and said second gate comprising:
forming a third semiconductor layer on said second semiconductor layer;
doping first portions of said third semiconductor layer with a second conductivity type dopant to form said source region and said drain region above said channel region;
doping a second portion of said third semiconductor layer with a first conductivity type dopant to form said second gate above said channel region and positioned laterally between said source region and said drain region; and
said forming of said source-to-channel strap comprising forming a dopant implant region in said second semiconductor layer adjacent to and abutting said channel region.

19. The method of claim 15, further comprising forming a gate contact on a different side of said asymmetric junction field effect transistor than said source-to-channel strap, said gate contact having said first conductivity type and extending vertically down through said channel region to at least said first gate.

* * * * *